United States Patent [19]

Konian

[11] Patent Number: 4,458,159

[45] Date of Patent: Jul. 3, 1984

[54] LARGE SWING DRIVER/RECEIVER CIRCUIT

[75] Inventor: Richard R. Konian, Poughkeepsie, N.Y.

[73] Assignee: International Business Machines Corporation, Armonk, N.Y.

[21] Appl. No.: 392,189

[22] Filed: Jun. 25, 1982

[51] Int. Cl.³ .................. H03K 19/013; H03K 3/01
[52] U.S. Cl. .................................. 307/270; 307/262; 307/445; 307/296 R
[58] Field of Search ............... 307/270, 262, 445, 300, 307/254, 296 R

[56] References Cited

U.S. PATENT DOCUMENTS

| | | | |
|---|---|---|---|
| 3,549,899 | 12/1970 | Beelitz | 307/215 |
| 3,654,490 | 4/1972 | Kan | 307/262 |
| 3,914,628 | 10/1975 | Pao et al. | 307/270 |
| 4,150,309 | 4/1979 | Tokuda | 307/296 R |
| 4,283,640 | 8/1981 | Konian | 307/270 |
| 4,287,435 | 9/1981 | Cavaliere et al. | 307/270 |

OTHER PUBLICATIONS

IBM Technical Disclosure Bulletin, vol. 12, No. 9, Feb. 1970, pp. 1387–1388, "Push–Pull Driver Circuit", K. Najmann, R. Remshardt and M. Illi.

Transistor Manual, Edited & Produced by the General Electric Co., Sixth Edition, 1962, pp. 97–99.

Primary Examiner—Stanley D. Miller
Assistant Examiner—B. P. Davis
Attorney, Agent, or Firm—Robert J. Haase

[57] ABSTRACT

Low voltage, low power transistor driver/receiver and logic circuits are disclosed comprising a pair of NPN transistors, the base of the first transistor being directly connected to an input terminal and, via a resistor, to the base of the second transistor. A third NPN transistor is connected with the second transistor in series circuit across a low voltage power supply. The junction between the series-connected transistors is coupled to an output terminal. A diode is connected between a point on the resistor and the collector of the second transistor to prevent saturation. The emitter of the second transistor is connected through a small or zero resistance to one terminal of the power supply. The down level at the output terminal is held by a transistor or diode clamp connected between the base of the third transistor and the other terminal of the power supply.

Various embodiments of the circuits are disclosed to provide driver and logic functions and to permit tailoring of the circuits to various load conditions requiring different output signal swing amplitudes and different response times.

10 Claims, 3 Drawing Figures

LARGE SWING DRIVER/RECEIVER CIRCUIT

DESCRIPTION

1. Technical Field

The invention generally relates to off-chip driver/receiver circuits and logic circuits utilizing transistors of the same conductivity type and characterized by low power dissipation and high speed and, more particularly, to such circuits handling output signal swings of enhanced amplitude.

2. Background

U.S. Pat. No. 4,283,640, assigned to the present assignee, teaches an all-NPN transistor driver and logic circuit capable of responding at high speed and with low power dissipation to somewhat limited input signal transitions of either increasing or decreasing sense. The circuit is especially suited for driving internal circuits of similar kind on-chip where large signal swings are not normally encountered. Circuits intended to receive logic signals originating off-chip or for delivering signals for driving circuits located off-chip, on the other hand, must be adapted for operation with signal swings of greater amplitude. The greater amplitude is required to accommodate the greater noise margin required by the inter-chip environment.

It is particularly desirable that the low power dissipation and high speed attributes of the circuit of the aforementioned patent be retained without serious compromise while a way be found to enhance its output signal swing capability for off-chip applications. It is further advantageous that the circuit be capable of a continuum of different output signal swing/delay tradeoffs to adapt it to different driving conditions, from the intra-chip situation of the circuit of the aforementioned patent to an off-chip driver/receiver.

The foregoing desiderata are not fully met by known prior circuits including, for example, those disclosed in U.S. Pat. Nos. 3,914,628 and 3,549,899 and in the IBM® Technical Disclosure Bulletin, Vol. 12, No. 9, Feb. 1970, p. 1387-8.

U.S. Pat. No. 3,914,628, issued Oct. 21, 1975 to Pao et al. and entitled "T-T-L Driver Circuitry" shows basically a three transistor driver circuit having an input connected in common manner to the bases of two of the transistors and omits resistors at both emitters, with transistors being operated in the saturation mode without maximum speed-power performance.

U.S. Pat. No. 3,549,899, issued Dec. 20, 1970 to Howard R. Beelitz and entitled "Input and Output Emitter-Follower CML Circuitry", teaches a similar three transistor current mode switching circuit also having an input connected in common manner to the bases of two of the transistors, but includes resistors at both emitters and through which circuit current never stops flowing.

The aforementioned Technical Disclosure Bulletin discloses a six transistor push-pull driver circuit requiring complementary input signals for controlling the push-pull output transistor pair. Circuit delay, power supply voltage and power dissipation are not minimized.

DISCLOSURE OF INVENTION

A three transistor low voltage, low power driver/receiver circuit is disclosed providing the fastest response time and lowest speed-power product consistent with the amplitude of the desired signal swing. The driver/receiver circuit comprises a pair of transistors of the same conductivity type, the base of the first transistor being directly connected to an input terminal and, via a resistor, to the base of the second transistor. A third transistor of the same type is connected with the second transistor of the transistor pair in series circuit across a power supply. The junction between the series-connected transistors is coupled to an output terminal. A diode is connected between a point on the resistor and the collector of the second transistor to prevent saturation.

The resistor increases the voltage swing available at the output terminal with a slight penalty which is confined to the response speed of the second transistor due to the increased charge/discharge time of the capacitance in the base circuit. The down level at the output terminal is reduced to a minimum by connecting the emitter of the second transistor through a small or zero resistance to one terminal of the power supply. The down level is held by a clamp connected between the base of the third transistor (then off) and the other terminal of the power supply. The third transistor is turned on and off under the control of the first transistor having emitter and collector resistors connected to respective terminals of the power supply.

Various embodiments of the present circuit are disclosed to provide driver/receiver and logic functions and to permit tailoring of the circuits to various load conditions requiring different output signal swing amplitudes and different response times.

BEST MODE FOR CARRYING OUT THE INVENTION

Collector current clamps are well known for avoiding saturation in switching circuits such as are discussed in the Transistor Manual, edited and produced by the General Electric Co., sixth edition, 1962, pages 97-99. It has been found, in accordance with the present invention, that a similar technique, if properly introduced into the driver and logic circuit of the aforementioned U.S. Pat. No. 4,283,640, will not only avoid saturation but will also provide the increased signal swing amplitude required for between-chip drivers and receivers without significantly detracting from the very desirable speed-power product characteristic of the original circuit. Push-pull action with only one collector delay between input and output also are retained.

Figure 1:
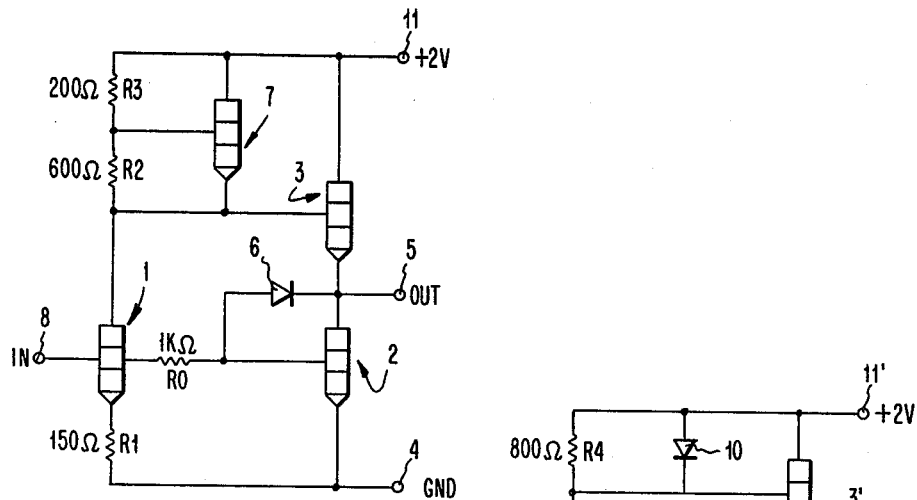
FIG. 1 is a schematic diagram of the preferred species of the present invention adapted for maximum output signal swing amplitude.

Transistors 1, 2, and 3, and biasing resistors $R_1$, $R_2$ and $R_3$ of FIG. 1 correspond to the respective components of the circuit of U.S. Pat. No. 4,283,640 during the negative-going transition of the input signal applied to terminal 8 when transistors 1 and 2 are cut off and transistor 3, connected to the positive power supply terminal 11, is driven into conduction to produce the up level excursion of the output signal. During the down level excursion of the output signal, biasing resistors $R_2$ and $R_3$ and transistor 7 set the potential to cut off transistor 3 and thereby determine the down level limit at terminal 5. Transistor 3 would turn on if the down level at terminal 5 fell one $V_{be}$ below the set level at the base of transistor 3. The down level excursion at terminal 5 is produced by an up level transition at input terminal 8 which turns on transistors 1 and 2 and turns off transistor 3.

The connection of resistor $R_0$ between the bases of transistors 1 and 2, and the direct connection of the emitter of transistor 2 to the negative power supply terminal 4 permit maximum reduction in the down level of the output signal swing at terminal 5. Placing $R_0$ in series with the Schottky diode provides the capability of separating the input from the output. The voltage drop that appears across $R_0$ is directly added to the output signal swing. Depending on the size of $R_0$ and the current flowing through it, a large signal swing is provided upwards of 900 milivolts which is appropriate for driver operation to drive between chips. In the driver operation where high current is required, any resistance in the emitter of transistor 3 would cause too large a voltage drop and absorb some of the voltage that is required for the large output swing. Thus, the best approach in that case is to directly connect the emitter to the power supply and use a large emitter area (somewhere in the 30–45 square micron range) to provide low resistance for sinking the high current.

Schottky diode 6 assures that saturation does not occur when transistor 2 conducts during the down level excursion of the output signal. Inasmuch as resistor $R_0$ is introduced only into the base circuit of transistor 2, the superior response speed of the overall driver circuit is only minimally slowed. The anode of diode 6 can be returned to a tap (not shown) on resistor $R_0$ to increase the antisaturation protection afforded by the diode or to raise the down level of the output signal swing at terminal 5.

Figure 2:
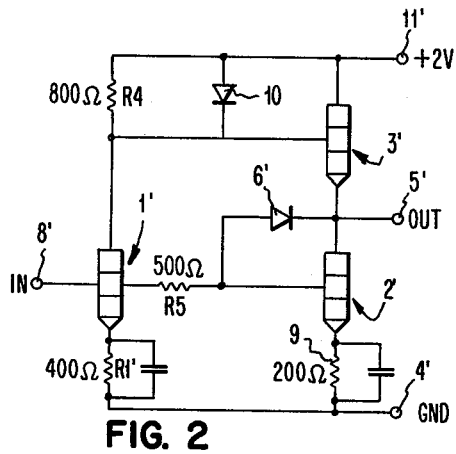
FIG. 2 is a schematic diagram of a modification of the circuit of FIG. 1 producing a lesser output signal swing amplitude but with reduced response delay.

The circuit of FIG. 2 is modified for applications where maximum reduction in the down level of the output signal swing at terminal 5' is not required. Accordingly, resistor $R_5$ is reduced in value relative to resistor $R_0$ of FIG. 1 (assuming that the circuits of FIGS. 1 and 2 are designed for use in the same application, e.g., both are receivers). The concomittant response time to input signal excursions is improved. Resistor 9 is introduced into the emitter of transistor 2' for down level current control when transistor 2' is conducting. Resistor $R_4$ and diode 10 replace resistors $R_2$ and $R_3$ and transistor 7 of FIG. 1 and act as a down level clamp for the modified output signal swing.

Figure 3:
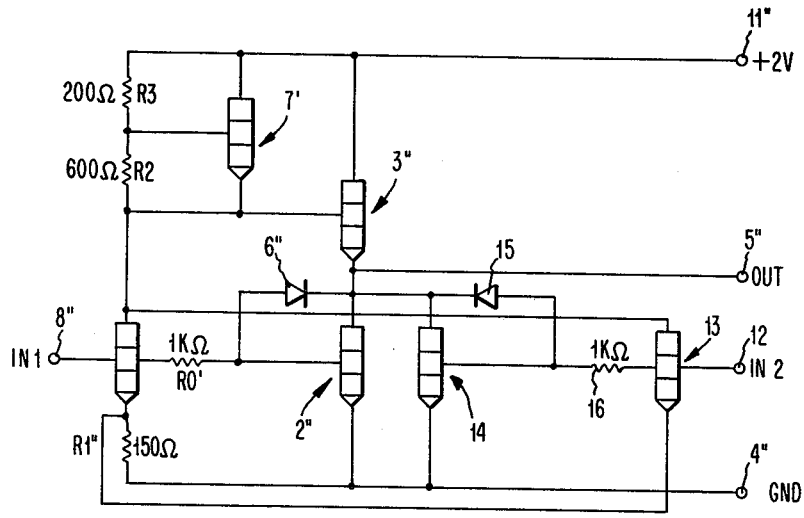
FIG. 3 is a schematic diagram of a plural input NOR circuit species of the invention.

The illustrative circuits of FIGS. 1 and 2 were described as drivers or receivers. As shown in FIG. 3, however, provision also can be made in either case for performing NOR logic. FIG. 3 shows such a case using a second input signal applied to terminal 12. Transistors 13 and 14, diode 15 and resistor 16 are added for this purpose and function similarly to transistors 1" and 2", diode 6" and resistor $R_0'$ previously described with reference to the signal applied to the first input terminal. The output signal at terminal 5" rises whenever the input signal falls at either or both of input logic terminals 8" or 12 in conventional NOR logic fashion.

Preferred parameter values are shown in the figures for receiver applications. All of the resistor values are to be scaled down for driver applications in accordance with the power desired to be delivered into the respective loads. Performance is reduced commensurately as the resistor values are reduced.

Computer simulations of the receiver circuits shown in the drawing have yielded the following comparative data relative to the circuit of the aforementioned U.S. Pat. No. 4,283,640:

| Circuit Type | Signal Swing | Delay | Power |
| --- | --- | --- | --- |
| '640 patent | 600 mv | 256 pico s | 2.6 mw |
| FIG. 2 | 800 mv | 330 pico s | 4 mw |
| FIG. 1 | 1000 mv | 450 pico s | 4 mw |

I claim:
1. A driver circuit comprising
a first resistor,
a first pair of transistors,
the base of one of said transistors being directly connected to an input terminal and, via said first resistor, to the base of the other of said transistors,
a power supply,
a third transistor of the same conductivity type as said pair of transistors,
said third transistor and said other transistor being connected in series circuit across said power supply,
the collector of said third transistor being directly connected to a respective terminal of said power supply,
an antisaturation diode connected between the base and collector of said other transistor,
a second resistor connected in shunt with a clamping means,
said second resistor connecting the junction of the collector of said one transistor and the base of said third transistor with the collector of said third transistor, and
a third resistor interconnecting the emitters of said one and said other transistors,
said power supply biasing said driver circuit so that substantially no current flows through at least said other transistor during the lowest voltage excursion of the input signal applied to said input terminal.
2. The circuit defined in claim 1 wherein said transistors are NPN type.
3. The circuit defined in claim 1 wherein said clamping means is a transistor having collector and emitter connected to opposite ends of said second resistor and base connected to an intermediate point on said second resistor.
4. The circuit defined in claim 1 wherein the emitter of said other transistor is directly connected to a respective terminal of said power supply.
5. The circuit defined in claim 1 wherein the emitter of said other transistor is connected via another resistor to a respective terminal of said power supply.
6. The circuit defined in claim 5 wherein said clamping means is a diode connected to opposite ends of said second resistor.
7. The circuit defined in claim 1 and further including a fourth resistor,
fourth and fifth transistors of said same conductivity type,
the base of said fourth transistor being directly connected to a second input terminal and, via said fourth resistor, to the base of said fifth transistor, and a second antisaturation diode connected between the base and collector of said fifth transistor, the collector and emitter of said fourth transistor being directly connected to the collector and emitter, respectively, of said one transistor, the collector and emitter of said fifth transistor being connected to the collector and emitter, respectively, of said other transistor.

8. The circuit defined in claim 7 wherein said transistors are NPN type.

9. The circuit defined in claim 7 wherein said clamping means is a transistor having collector and emitter connected to opposite ends of said second resistor and base connected to an intermediate point on said second resistor.

10. The circuit defined in claim 7 wherein the emitter of said other transistor and the emitter of said fifth transistor are directly connected to a respective terminal of said power supply.

* * * * *